United States Patent
Feyh et al.

(10) Patent No.: US 11,402,288 B2
(45) Date of Patent: Aug. 2, 2022

(54) MEMBRANE-BASED SENSOR HAVING A PLURALITY OF SPACERS EXTENDING FROM A CAP LAYER

(71) Applicants: Robert Bosch GmbH, Stuttgart (DE); Ando Lars Feyh, Reutlingen (DE); Gary O'Brien, Palo Alto, CA (US)

(72) Inventors: Ando Lars Feyh, Reutlingen (DE); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 650 days.

(21) Appl. No.: 15/301,226

(22) PCT Filed: Apr. 3, 2015

(86) PCT No.: PCT/US2015/024194
§ 371 (c)(1),
(2) Date: Sep. 30, 2016

(87) PCT Pub. No.: WO2015/153938
PCT Pub. Date: Oct. 8, 2015

(65) Prior Publication Data
US 2017/0023426 A1 Jan. 26, 2017

Related U.S. Application Data

(60) Provisional application No. 61/975,175, filed on Apr. 4, 2014.

(51) Int. Cl.
*G01L 9/00* (2006.01)
*H04R 19/00* (2006.01)
(Continued)

(52) U.S. Cl.
CPC .......... *G01L 9/0047* (2013.01); *B81B 3/0072* (2013.01); *G01L 9/0048* (2013.01);
(Continued)

(58) Field of Classification Search
CPC ....... G01L 13/00; G01L 15/00; G01L 9/0042; G01L 9/0048; G01L 2009/0066;
(Continued)

(56) References Cited

U.S. PATENT DOCUMENTS 4,216,401 A * 8/1980 Wagner .................. B60R 13/10
310/313 R
4,628,740 A * 12/1986 Ueda ..................... G01L 9/0001
250/231.19

(Continued)

OTHER PUBLICATIONS

Supplementary European Search Report corresponding to European Patent Application No. 15 77 2419 (10 pages).
(Continued)

*Primary Examiner* — Tran M. Tran
(74) *Attorney, Agent, or Firm* — Maginot, Moore & Beck LLP

(57) ABSTRACT

A membrane-based sensor in one embodiment includes a membrane layer including an upper surface and a lower surface, a backside trench defined on one side by the lower surface, a central cavity defined on a first side by the upper surface, a cap layer positioned above the central cavity, and a first spacer extending from the upper surface to the cap layer and integrally formed with the cap layer, the first spacer defining a second side of the central cavity and an inner membrane portion of the membrane layer.

15 Claims, 3 Drawing Sheets

(51) Int. Cl.
  *G01L 19/04*   (2006.01)
  *G01L 19/06*   (2006.01)
  *H04R 19/04*   (2006.01)
  *B81B 3/00*    (2006.01)
  *H04R 31/00*   (2006.01)

(52) U.S. Cl.
  CPC ............ *G01L 9/0073* (2013.01); *G01L 19/04* (2013.01); *G01L 19/06* (2013.01); *H04R 19/005* (2013.01); *H04R 19/04* (2013.01); *B81B 2201/0257* (2013.01); *B81B 2201/0264* (2013.01); *B81C 2201/014* (2013.01); *H04R 31/00* (2013.01)

(58) Field of Classification Search
  CPC ... G01L 9/0072; G01L 9/0073; G01L 9/0075; G01L 19/146; G01L 19/145; G01L 9/12; G01L 19/06; G01L 19/0618; B81C 1/00365; B81C 1/00238; B81C 1/00357
  See application file for complete search history.

(56) References Cited

U.S. PATENT DOCUMENTS

| | | | | |
|---|---|---|---|---|
| 4,849,071 A * | | 7/1989 | Evans | G01L 9/0042 438/53 |
| 5,209,121 A * | | 5/1993 | Hafner | G01L 9/006 338/4 |
| 5,220,838 A * | | 6/1993 | Fung | G01L 9/0042 29/621.1 |
| 5,277,068 A * | | 1/1994 | Fukiura | G01L 9/0072 361/283.1 |
| 5,295,395 A * | | 3/1994 | Hocker | H01L 21/2007 257/E21.122 |
| 5,357,808 A * | | 10/1994 | Fung | G01L 9/0042 338/4 |
| 5,438,875 A * | | 8/1995 | Fung | G01L 9/0042 29/424 |
| 5,479,827 A * | | 1/1996 | Kimura | G01L 9/0075 361/283.4 |
| 5,553,506 A * | | 9/1996 | Benz | G01L 9/0019 73/862.59 |
| 5,801,313 A * | | 9/1998 | Horibata | G01L 9/0073 361/283.4 |
| 5,824,910 A * | | 10/1998 | Last | F15C 5/00 73/715 |
| 5,891,751 A * | | 4/1999 | Kurtz | B81B 7/0077 148/DIG. 12 |
| 6,346,742 B1 * | | 2/2002 | Bryzek | G01L 19/0038 257/419 |
| 6,426,239 B1 | | 7/2002 | Gogoi et al. | |
| 6,535,460 B2 * | | 3/2003 | Loeppert | B81B 3/0072 367/181 |
| 6,604,425 B1 * | | 8/2003 | Hsu | G01L 1/086 73/718 |
| 6,612,178 B1 * | | 9/2003 | Kurtz | G01L 9/0052 73/715 |
| 6,635,519 B2 * | | 10/2003 | Barber | H03H 3/04 257/414 |
| 6,655,216 B1 * | | 12/2003 | Aizawa | G01L 9/006 73/700 |
| 6,700,174 B1 | | 3/2004 | Miu et al. | |
| 6,848,320 B2 * | | 2/2005 | Miyajima | B81B 3/0021 73/763 |
| 6,890,834 B2 * | | 5/2005 | Komobuchi | B81B 7/0077 257/E23.193 |
| 7,111,518 B1 * | | 9/2006 | Allen | G01L 9/0042 73/715 |
| 7,202,560 B2 * | | 4/2007 | Dungan | B81C 1/0023 257/713 |
| 7,247,246 B2 * | | 7/2007 | Nasiri | B81C 1/00238 216/2 |
| 7,442,570 B2 * | 10/2008 | Nasiri | B81C 1/00238 438/48 |
| 7,478,559 B2 * | 1/2009 | Tan | G01F 23/18 73/718 |
| 7,484,419 B2 * | 2/2009 | Tsuda | G01L 19/0007 73/756 |
| 7,508,040 B2 * | 3/2009 | Nikkei | G01L 9/0052 257/414 |
| 7,622,782 B2 * | 11/2009 | Chu | B81C 3/001 257/415 |
| 7,651,879 B2 * | 1/2010 | Cobianu | G01L 9/0025 257/E27.006 |
| 7,661,318 B2 * | 2/2010 | Brosh | G01L 19/146 73/715 |
| 7,704,774 B2 * | 4/2010 | Mayer | B81C 1/0023 257/E21.001 |
| 7,805,821 B2 * | 10/2010 | Suzuki | H04R 19/005 29/25.35 |
| 7,856,804 B2 * | 12/2010 | Laming | B81C 1/00158 257/415 |
| 7,891,252 B2 * | 2/2011 | Cobianu | B60C 23/0408 310/324 |
| 7,955,885 B1 * | 6/2011 | Bhugra | B81C 1/00301 257/E21.499 |
| 8,096,196 B2 * | 1/2012 | Eilersen | G01L 19/04 73/862.041 |
| 8,143,082 B2 * | 3/2012 | Dungan | B81C 1/0023 438/50 |
| 8,215,176 B2 * | 7/2012 | Ding | G01L 19/0069 361/283.4 |
| 8,384,168 B2 * | 2/2013 | Hooper | G01L 9/0052 257/415 |
| 8,387,464 B2 * | 3/2013 | McNeil | B81B 7/02 73/718 |
| 8,426,934 B2 * | 4/2013 | Lee | B81C 1/00182 257/416 |
| 8,445,976 B2 * | 5/2013 | Yamazaki | H01H 59/0009 200/181 |
| 8,476,087 B2 * | 7/2013 | Hooper | G01L 19/141 438/17 |
| 8,627,559 B2 * | 1/2014 | Suminto | G01L 9/0042 257/659 |
| 8,667,849 B2 * | 3/2014 | Sato | G01L 9/008 361/283.4 |
| 8,984,950 B2 * | 3/2015 | Potasek | G01L 9/0048 73/715 |
| 9,066,180 B2 * | 6/2015 | Zoellin | H04R 19/005 |
| 9,212,054 B1 * | 12/2015 | Kwa | B81C 1/00674 |
| 9,340,412 B2 * | 5/2016 | Besling | B81C 1/00158 |
| 9,369,808 B2 * | 6/2016 | Chen | H04R 19/005 |
| 9,506,827 B2 * | 11/2016 | Kwa | G01L 9/0042 |
| 9,516,428 B2 * | 12/2016 | Dehe | B81B 3/0018 |
| 9,546,922 B2 * | 1/2017 | Ding | G01L 19/04 |
| 9,581,512 B2 * | 2/2017 | Lin | B23P 19/04 |
| 9,709,451 B2 * | 7/2017 | Kaelberer | G01P 15/0802 |
| 9,764,947 B2 * | 9/2017 | Chiou | G01L 9/0044 |
| 2003/0222660 A1 * | 12/2003 | Morimoto | G01L 1/142 324/661 |
| 2007/0291964 A1 * | 12/2007 | Chien | H04R 19/04 381/174 |
| 2009/0120195 A1 * | 5/2009 | Willcox | G01F 1/383 73/718 |
| 2009/0193903 A1 | 8/2009 | Cobianu et al. | |
| 2009/0278217 A1 | 11/2009 | Laming et al. | |
| 2010/0133630 A1 | 6/2010 | Scheuerer et al. | |
| 2010/0186515 A1 * | 7/2010 | Sakurai | G01L 9/0022 73/702 |
| 2010/0224004 A1 | 9/2010 | Suminto et al. | |
| 2011/0108933 A1 * | 5/2011 | Nakatani | B81C 1/00238 257/415 |
| 2012/0031189 A1 * | 2/2012 | Sato | G01L 9/085 73/717 |
| 2013/0207208 A1 | 8/2013 | Graham et al. | |
| 2013/0214370 A1 * | 8/2013 | Hussain | G01L 9/0055 257/420 |

(56) References Cited

U.S. PATENT DOCUMENTS

| | | | |
|---|---|---|---|
| 2015/0109889 A1* | 4/2015 | Chen | H04R 19/005 |
| | | | 367/189 |
| 2015/0260593 A1* | 9/2015 | Hsu | G01L 9/0072 |
| | | | 73/754 |
| 2016/0023891 A1* | 1/2016 | Reinmuth | G01L 19/143 |
| | | | 257/416 |
| 2016/0033349 A1* | 2/2016 | Abed | G01L 9/0048 |
| | | | 257/419 |
| 2017/0219449 A1* | 8/2017 | Yin | G01L 9/0044 |
| 2018/0202807 A1* | 7/2018 | Schelling | B81C 1/00357 |

OTHER PUBLICATIONS

International Search Report corresponding to PCT Application No. PCT/US2015/024194, dated Jun. 30, 2015 (4 pages).

\* cited by examiner

MEMBRANE-BASED SENSOR HAVING A PLURALITY OF SPACERS EXTENDING FROM A CAP LAYER

This application is a 35 U.S.C. § 371 National Stage Application of PCT/US2015/024194, filed on Apr. 3, 2015, which claims the benefit of priority of U.S. provisional application Ser. No. 61/975,175, filed Apr. 4, 2014. The disclosures of the above-identified patent applications are incorporated herein by reference in their entireties.

FIELD

The present disclosure relates to sensors and, more particularly, to micro-scale membrane sensors.

BACKGROUND

Membrane-based sensors, such as pressure sensors, acoustic transducers, or microphones, are typically realized using a backside wafer-trench process to define the membrane of the sensor. The position and/or the diameter of the backside trench often varies considerably due to the depth of the etching process needed to define the membrane in the sensor. The variation of these positional and geometric trench attributes may cause effects such as footing in instances when a trench stops on an oxide layer during formation of the membrane. An over-etch may result in a lateral undercut of the sensor structure and, in turn, form a locally larger hole diameter. Such diametric variations along the backside trench may lead to a variation in the effective membrane diameter and result in reduced membrane stiffness. In the case of a capacitive pressure sensor, the diametric variations may lead to an unwanted increase in sensor sensitivity. Precise process control is difficult to obtain since the backside wafer-trench process varies considerably from wafer to wafer. As a result, sensors produced by conventional membrane formation techniques will have small variations in sensor performance from sensor to sensor.

FIG. 1 shows a cross section of a prior art membrane-based sensor 100 that is susceptible to the positional and dimensional variations discussed above. For illustrative purposes only, the sensor 100 is shown as a capacitive pressure sensor. The sensor 100 has three semiconductor layers which include a substrate or base layer 102, an intermediate layer 104, and a backplate or cap layer 106. The sensor 100 also has at least two dielectric layers which include a first oxide layer 108 located between the base layer 102 and the intermediate layer 104 and a second oxide layer 110 located substantially between the intermediate layer 104 and the cap layer 106. The first oxide layer 108 electrically decouples the intermediate layer 104 from the base layer 102, and the second oxide layer 110 electrically decouples the intermediate layer 104 from the cap layer 106.

A cavity 112 etched from a portion of the second oxide layer 110 isolates a portion of the intermediate layer 104 from the cap layer 106. The portions of the intermediate layer 104 and the cap layer 106 adjacent to the cavity 112 form the two sides of a capacitor defined within the capacitive pressure sensor shown in the figure. The cavity 112 is etched through a plurality of vent holes 114 formed in the cap layer 106 and defines an upper surface 116 of the intermediate layer 104. The etching of the cavity 112 also defines lower cap portion 118 of the cap layer 106 which is located generally opposite the upper surface 116. The vent holes 114 may be closed (not shown) via a thin film or any other encapsulation process so as to enclose a reference pressure or a reference vacuum for a pressure sensor application.

A backside trench 120 etched from portions of the base layer 102 and the first oxide layer 108 defines a lower surface 122 of the intermediate layer 104. The upper surface 116 and the lower surface 122 collectively define the membrane 124 of the sensor 100. As noted above, the conventional deep etching process used to form the backside trench 120 results in considerable positional and diametric variation from wafer to wafer and within a single wafer. In some cases, the diametric variation can be on the order of five (5) to fifty (50) µm along the backside trench 120. Moreover, the configuration of the membrane 124 within the prior art sensor 100 allows direct coupling of external stress into the membrane 124. As a result, the behavior of prior art sensors is largely dependent on external stresses induced by the operating environment of the sensor, such as from temperature change, and/or external stresses induced due to manufacturing process, such as during the packaging of the sensor.

What is needed, therefore, is a membrane-based sensor having a backside trench with limited positional and diametric variation from wafer to wafer or within one wafer. A sensor device with a membrane substantially decoupled from external stresses is also desirable. A robust fabrication method for defining a sensor membrane within a sensor device in a precision controlled manner is further desirable.

SUMMARY

In accordance with one embodiment, a membrane-based sensor includes a membrane layer including an upper surface and a lower surface, a backside trench defined on one side by the lower surface, a central cavity defined on a first side by the upper surface, a cap layer positioned above the central cavity, and a first spacer extending from the upper surface to the cap layer and integrally formed with the cap layer, the first spacer defining a second side of the central cavity and an inner membrane portion of the membrane layer.

In one or more embodiments, an area of the upper surface surrounded by the first spacer is smaller than an area of the lower surface that defines the one side of the backside trench.

In one or more embodiments a membrane-based sensor includes a cap electrode defined in a portion of the cap layer directly above the central cavity.

In one or more embodiments a membrane-based sensor includes a peripheral cavity defined on a third side by the upper surface and defined on a fourth side by the first spacer, and a second spacer extending from the upper surface to the cap layer and integrally formed with the cap layer, the second spacer defining a fifth side of the peripheral cavity and an outer membrane portion of the membrane layer.

In one or more embodiments the peripheral cavity extends laterally beyond the backside trench.

In one or more embodiments a membrane-based sensor includes a first dielectric layer portion positioned between the cap layer and the membrane layer, the first dielectric layer portion surrounding the second spacer.

In one or more embodiments a membrane-based sensor includes a second dielectric layer portion positioned directly beneath the membrane layer, the second dielectric layer portion surrounding the backside trench.

In one or more embodiments the central cavity is sealed at a reference pressure.

In one embodiment a method of forming a membrane-based sensor includes forming a central trench through a first dielectric layer to expose a first upper surface portion of a membrane layer, forming a first spacer as an etch stop within the central trench on the first upper surface portion, forming a cap layer integrally with the first spacer, etching a central cavity through the cap layer, a lateral edge of the central cavity defined by the first spacer as an etch stop, and forming a backside trench to expose a lower surface of the membrane layer.

In one or more embodiments etching the central cavity includes exposing a first area of the upper surface, forming the backside trench includes exposing a second area of the lower surface, and the first area is less than the second area.

In one or more embodiments a method of forming a membrane-based sensor includes forming a cap electrode in a portion of the cap layer located inwardly of the central trench.

In one or more embodiments a method of forming a membrane-based sensor includes forming a peripheral trench through the first dielectric layer to expose a second upper surface portion of a membrane layer, forming a second spacer integrally with the cap layer as an etch stop within the peripheral trench on the second upper surface portion, and etching a peripheral cavity through the cap layer, a first lateral edge of the peripheral cavity defined by the first spacer as an etch stop and a second lateral edge of the peripheral cavity defined by the second spacer as an etch stop.

In one or more embodiments a method of forming a membrane-based sensor includes forming the backside trench with a lateral extent that is less than a lateral extent of the peripheral cavity.

In one or more embodiments forming a cap layer includes forming the cap layer at least partially on an upper surface of the first dielectric layer.

In one or more embodiments forming the backside trench includes forming the backside trench through a second dielectric layer positioned directly beneath the membrane layer.

In one or more embodiments a method of forming a membrane-based sensor includes establishing a desired pressure within the central cavity, and sealing the central cavity after establishing the desired pressure.

DESCRIPTION

Figure 1:
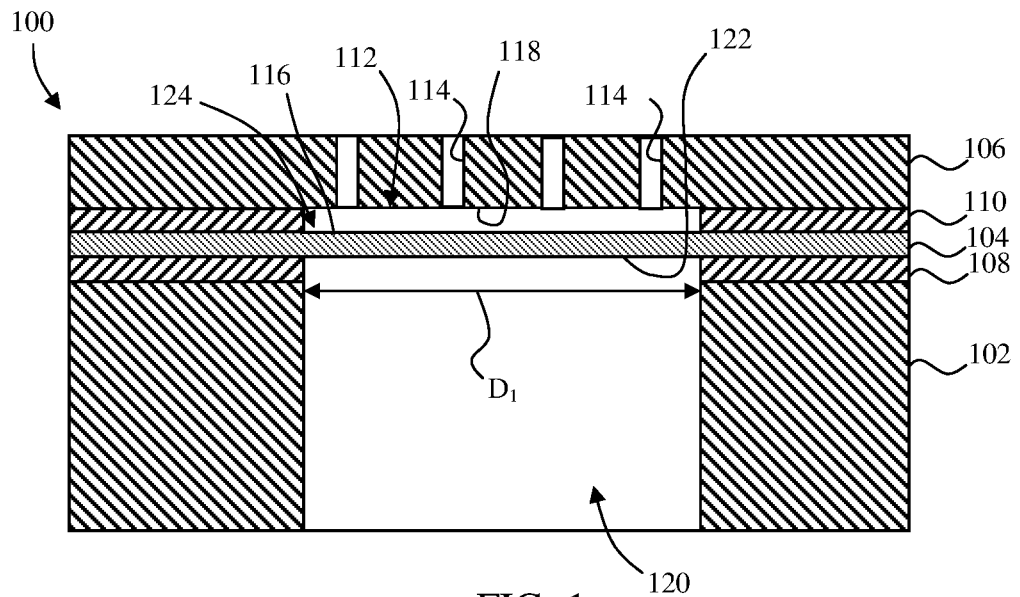
FIG. 1 depicts a side cross-sectional view of a prior art sensor device with a sensor membrane defined on a lower side by a deep trench and on an upper side by a cavity formed to approximate the lateral dimension of the deep trench.

For the purpose of promoting an understanding of the principles of the disclosure, reference will now be made to the embodiments illustrated in the drawings and described in the following written specification. It is understood that no limitation to the scope of the disclosure is thereby intended. It is further understood that the disclosure includes any alterations and modifications to the illustrated embodiments and includes further applications of the principles of the disclosure as would normally occur to one skilled in the art to which this disclosure pertains.

Figure 2:
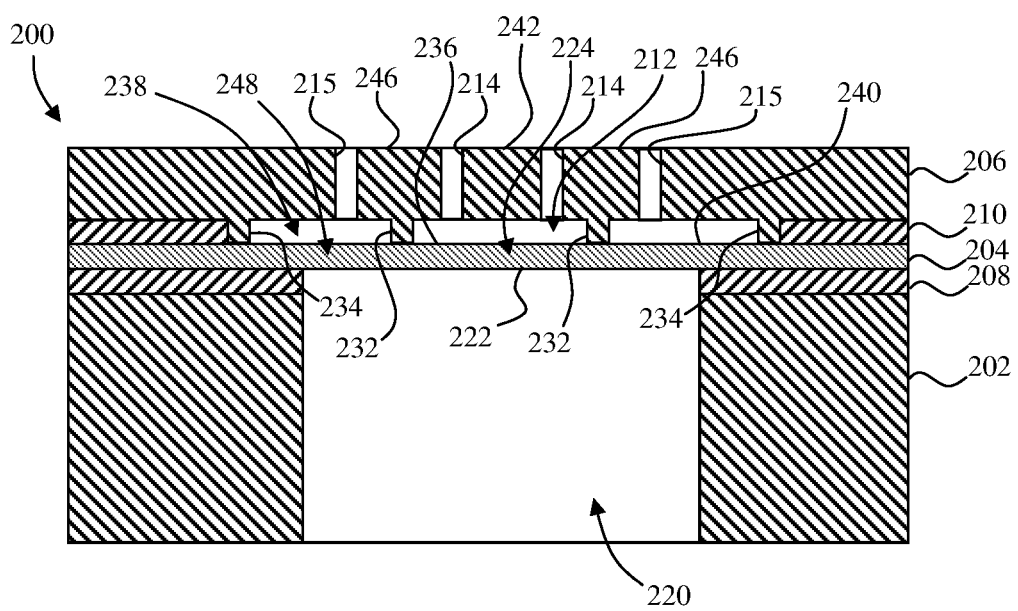
FIG. 2 shows a side cross-sectional view a sensor device according to one embodiment including a spacer that anchors a portion of a device layer to define a sensor membrane therein.

FIG. 2 shows a section view of a sensor device 200 according to one embodiment. The sensor device 200 has at least three semiconductor layers which include a substrate layer or base layer 202, an intermediate layer 204, and a backplate layer or cap layer 206. The sensor device 200 also has at least two dielectric layers which include a first oxide layer 208 located between the base layer 202 and the intermediate layer 204 and a second oxide layer 210 located partially between the intermediate layer 204 and the cap layer 206. The first oxide layer 208 electrically decouples the intermediate layer 204 from the base layer 202. The second oxide layer 210 partially decouples the intermediate layer 204 from the cap layer 206.

The second oxide layer 210 includes a plurality of spacers located between the cap layer 206 and the intermediate layer 204. In the embodiment shown in FIG. 2, the spacers include at least two inner spacers 232 spaced laterally apart from one another and preferably at least two outer spacers 234. A first of the outer spacers 234 is spaced outwardly from the left-most one of the inner spacers 232 as viewed in the figure and a second of the outer spacers 234 is spaced outwardly from the right-most one of inner spacers 232 as viewed in the figure. The spacers are preferably realized using a perimeter-like closed configuration such that the spacers form a single ring, but they appear in cross section as two separate spacers.

A central cavity 212 located between the inner spacers 232 isolates an upper central surface 236 of the intermediate layer 204 from the cap layer 206. A peripheral cavity 238 located between the inner spacers 232 and the outer spacers 234 isolates an upper peripheral surface 240 of the intermediate layer 204 from the cap layer 206. In the embodiment shown, the peripheral cavity 238 surrounds the central cavity 212 and is separated from the central cavity 212 by the inner spacers 232. In some embodiments, the cavities are connected to different pressures. In another embodiments, both cavities are connected to the same pressure. In some embodiments, the outer peripheral cavity, after formation, is filled with an insulating oxide, a semi-conducting silicon material, or the like.

A central trench portion 214 extending through the cap layer 206 laterally isolates an electrode 242 within the cap layer 206. The electrode 242 is located above the central cavity 212 and aligned with the upper central surface 236 of the intermediate layer 204. A peripheral trench portion 215 spaced outwardly from the central trench portion 214 laterally isolates at least two spacer portions 246 within the cap layer 206. A first of the spacer portions 246 is anchored to the first of the inner spacers 232 and a second of the spacer portions 246 is anchored to the second of the inner spacers 232. The spacer portions 246 are each laterally insulated from the electrode 242 and from other portions of the cap layer 206 by the trench portions 214, 215.

A backside trench 220 exposes a lower surface 222 of the intermediate layer 204. The lower surface 222 and the upper central surface 236, which is located between the inner spacers 232, collectively define a sensor membrane or inner membrane 224 of the sensor device 200. The inner membrane 224 and the electrode 242 collectively define a capacitor within the sensor device 200. The size of the inner membrane 224 is precisely controlled since the positioning of the inner spacers 232 sets the position and the lateral dimension of the inner membrane 224 within the sensor device 200. In some embodiments, the inner membrane 224 may vary in size by less than one (1) μm from wafer to wafer or within a single wafer.

The lower surface 222 and the upper peripheral surface 240, which is located between the inner spacers 232 and the outer spacers 234, collectively define a buffer membrane/buffer area or outer membrane 248 of the sensor device 200. In the embodiment shown in FIG. 2, the outer membrane 248 does not provide an electrical function and, instead, provides only mechanical function. For example, the outer membrane 248 compensates for any variations in the diameter of the backside trench 220 since the position and the size of inner membrane 224 is no longer affected by the diameter of the backside trench 220. The outer membrane 248 also compensates for external stress on the sensor device 200 by deflecting slightly under an external load to absorb the external stress.

Figure 3:
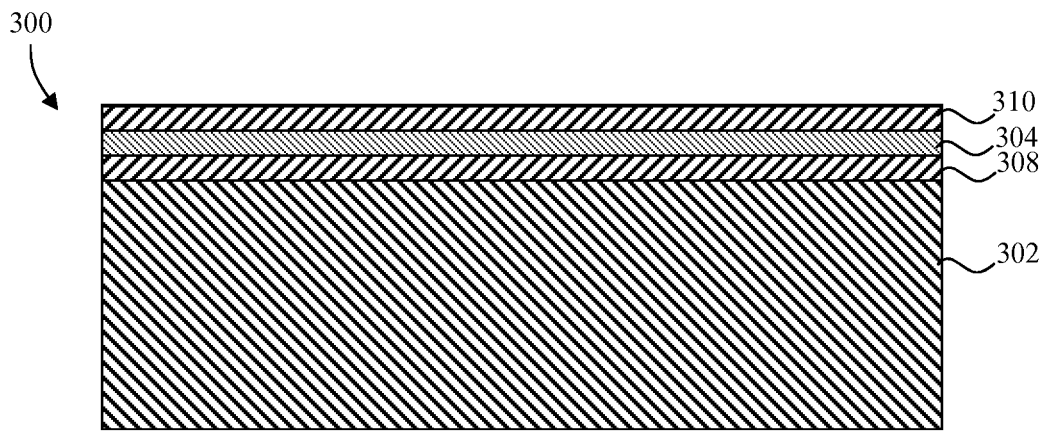
FIGS. 3-7 depict a process for forming the sensor device of FIG. 2.
Figure 4:
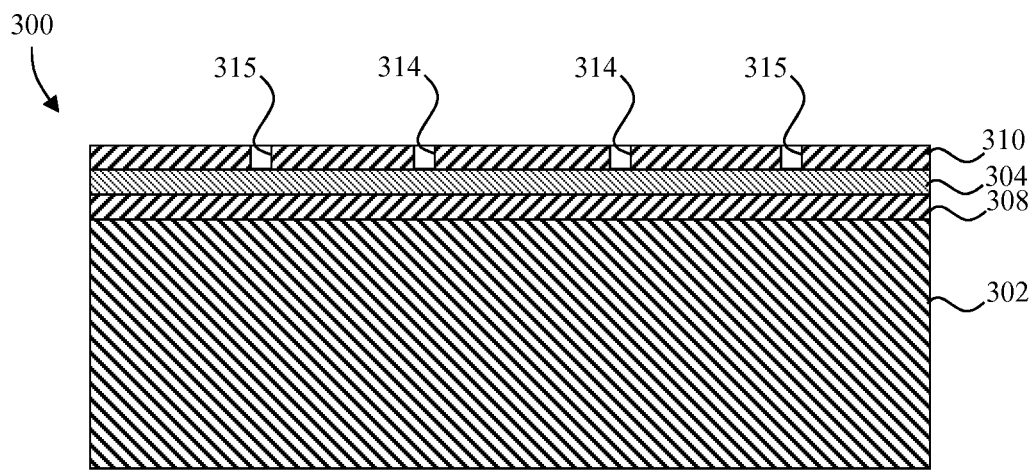

A process for forming a sensor device such as the sensor device 200 is discussed with reference to FIGS. 3-7. Referring initially to FIG. 3, an oxide layer 310 is formed on a silicon-on-insulator (SOI) wafer 300 which includes a base layer 302, a buried oxide layer 308, and an intermediate layer 304. In the embodiment shown, the intermediate layer 304 is a layer of poly- or epitaxial-silicon. The oxide layers 308, 310 in the embodiment shown are layers of silicon dioxide ($SiO_2$) that can be, for example, grown by a thermal oxidation process or deposited using PECVD or LPCVD processes. FIG. 4 shows the oxide layer 310 patterned to expose portions of the intermediate layer 304. The patterning of the oxide layer 310 forms a central trench portion 314 and a peripheral trench portion 315 spaced outwardly from the central trench portion. In some embodiments, only the central trench portion 314 is patterned in the oxide layer 310.

Figure 5:
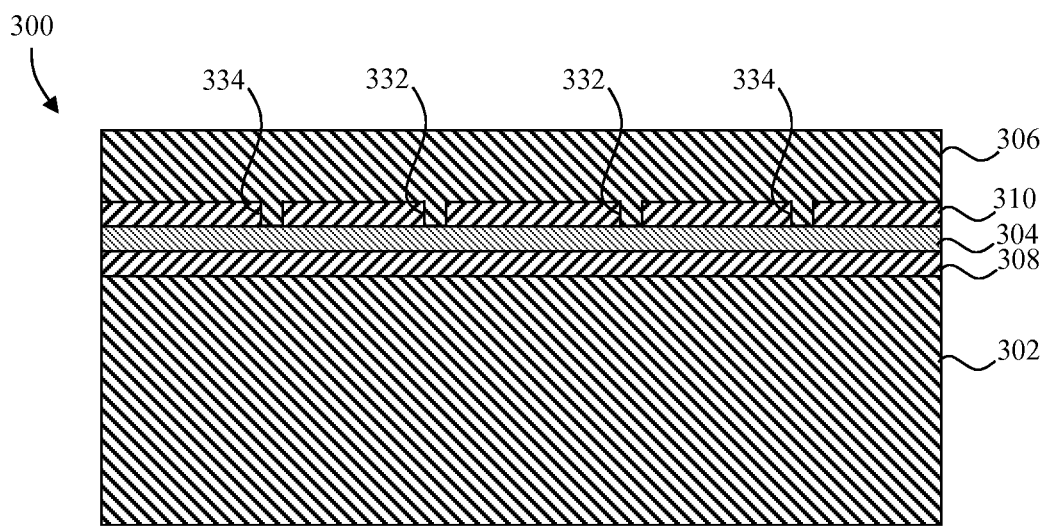

Referring now to FIG. 5, a layer of silicon is deposited above the patterned oxide layer 310 to form a cap layer 306 of the wafer 300. The cap layer 306 is deposited by chemical vapor deposition (CVD) or, more particularly, low pressure chemical vapor deposition (LPCVD), or via epitaxial layer growth. The cap layer 306 fills the trench portions 314, 315 and forms a plurality of spacers located between the cap layer 306 and the intermediate layer 304. In the SOI wafer 300 shown in FIG. 5, the spacers include at least two inner spacer portions 332 spaced laterally apart from one another and at least two outer spacer portions 334. A first of the outer spacer portions 334 is spaced outwardly from the left-most one of the inner spacer portions 332 as viewed in the figure and a second of the outer spacer portions 334 is spaced outwardly from the right-most one of inner spacer portions 332 as viewed in the figure. In embodiments with only the central trench portion 314 patterned in the oxide layer 310, only the inner spacer portions 332 are formed in the wafer 300 during the deposition of the cap layer 306.

Figure 6:
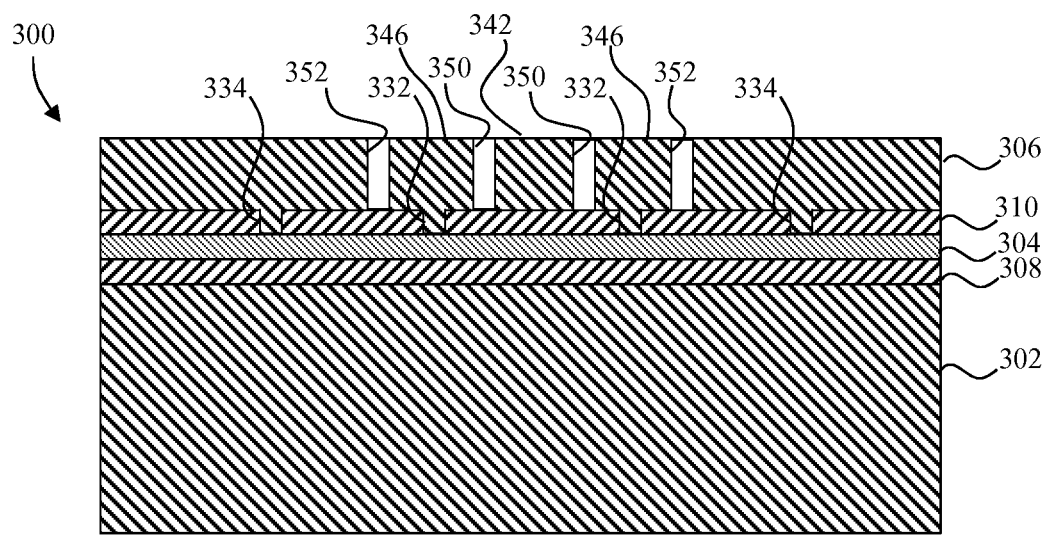

FIG. 6 shows the cap layer 306 of the wafer 300 with a trench portion etched therethrough. The trench portion in the embodiment shown includes a central trench portion 350 and a peripheral trench portion 352 spaced outwardly from the central trench portion 350. The central trench portion 350 is positioned to expose portions of the oxide layer 310 located between the inner spacers 314, and the peripheral trench portion 352 is positioned to expose portions of the oxide layer 310 located between the inner and the outer spacers 314, 315. The etching of the central trench portion 350 electrically isolates an electrode 342 within the cap layer 306. The etching of the peripheral trench portion 352 isolates at least two spacer portions 346 within the cap layer 306. In some embodiments, vents holes (not shown) can also be etched through portions of the cap layer 306 to expose further portions of the oxide layer 310 located between the spacers 314, 315.

Figure 7:
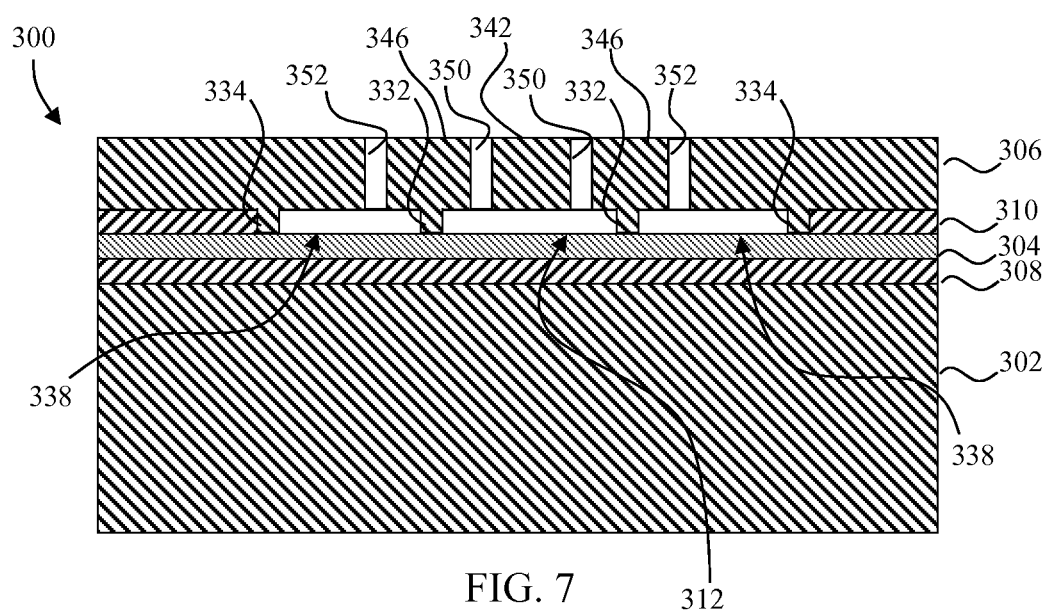

Referring now to FIG. 7, after the trench portions 350, 352 are etched, a hydrofluoric acid (HF) vapor etch release is performed which releases entirely the portion of the oxide layer 310 located between the spacers 332, 334. The etching process forms a central cavity 312 between the inner spacers 332, the intermediate layer 304, and the cap layer 306. The etching process also forms a peripheral cavity 338 between the inner and the outer spacers 332, 334, the intermediate layer 304, and the cap layer 304. The central cavity 312 and the central trench portion 350 electrically decouple the electrode 342 from the intermediate layer 304 and the cap layer 306. A backside trench (220 in FIG. 2) is etched from portions of the base layer 302 and the buried oxide layer 308 to expose a lower surface (222 in FIG. 2) of the intermediate layer 304. The etching of the backside trench in the wafer 300 results in the configuration of the sensor device 200 shown in FIG. 2.

As discussed in more detail above with reference to FIG. 2, the portion of the intermediate layer 204 exposed by the central cavity 212 (e.g., the upper central surface 236) defines the inner membrane 224 of the sensor device 200. Since the silicon-filled spacers 232, 234 provide a hard stop during the etching process (FIG. 6), it is the patterning of the oxide layer 310 (FIG. 4) that defines the position and the size of the central cavity 212 and, therefore, the position and size of the inner membrane 224. The formation of the membrane using the above-described process is substantially more controllable than the prior art fabrication methods since the patterning process that defines the membrane is performed through a relatively thin depth (e.g., the oxide layer 210). Moreover, a timed-etch process is no longer relied upon to form the membrane-defining cavity (124 in FIG. 1) within the oxide layer since the spacers 232, 234 function as etch stops during formation of the central cavity 212 in the sensor 200.

The membrane-based sensor produced using the above-described process includes an inner membrane as a sensor membrane and an outer membrane as a buffer membrane. The inner membrane is defined by precision-formed anchor structures, and the inner membrane has both electrical and mechanical functionality. The outer membrane is also defined by the precision-formed anchor structures, but the outer membrane has only mechanical functionality. In particular, the outer membrane functions to compensate for any process variations and/or non-uniformities during the backside trench process and for external stress affecting the sensor performance. The membrane-based sensor in various embodiments may be a pressure sensor, a capacitive pressure sensor, a microphone, and capacitive microphone.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:
1. A membrane-based sensor, comprising:
   a membrane layer defining a membrane plane and including an upper surface and a lower surface facing away from one another relative to the membrane plane;
   a backside trench defined on a lower side by the lower surface;

a central cavity defined on a first side by the upper surface;

a cap layer positioned above the central cavity and the upper surface;

a first spacer extending from the cap layer to the upper surface of the membrane layer and integrally formed with the cap layer, the first spacer having (i) a first inner surface that defines a second side of the central cavity and (ii) a first outer surface that faces away from the first inner surface, the first spacer directly contacting the upper surface to define an inner membrane portion of the membrane layer; and a cap electrode defined in a portion of the cap layer directly above the central cavity.

2. The membrane-based sensor of claim 1, wherein an area of the upper surface surrounded by the first spacer is smaller than an area of the lower surface that defines the lower side of the backside trench.

3. The membrane-based sensor of claim 1, further comprising:

a peripheral cavity positioned laterally relative to the central cavity and defined on a third side by the upper surface of the membrane layer and defined on a fourth side by the first outer surface of the first spacer; and a second spacer extending from the cap layer to the upper surface of the membrane layer and integrally formed with the cap layer, the second spacer having a second inner surface that defines a fifth side of the peripheral cavity, the second spacer directly contacting the upper surface to define an outer membrane portion of the membrane layer disposed between the first spacer and the second spacer.

4. The membrane-based sensor of claim 3, wherein the peripheral cavity extends laterally beyond the backside trench.

5. The membrane-based sensor of claim 4, further comprising:

a first dielectric layer portion positioned between the cap layer and the membrane layer, the first dielectric layer portion surrounding the second spacer.

6. The membrane-based sensor of claim 4, further comprising:

a second dielectric layer portion positioned directly beneath the membrane layer, the second dielectric layer portion surrounding the backside trench.

7. The membrane-based sensor of claim 1, wherein the first spacer delimits the upper surface of the membrane layer into an upper central surface portion surrounded by the first spacer and an upper peripheral surface portion that surrounds the first spacer.

8. The membrane-based sensor of claim 7, wherein an area of the upper central surface portion is smaller than an area of the lower surface that defines the lower side of the backside trench.

9. The membrane-based sensor of claim 7, further comprising:

a peripheral cavity positioned laterally relative to the central cavity and defined on a third side by the upper peripheral surface portion of the membrane layer and defined on a fourth side by the first outer surface of the first spacer; and a second spacer extending from the cap layer to the upper surface of the membrane layer and integrally formed with the cap layer, the second spacer having a second inner surface that defines a fifth side of the peripheral cavity, the second spacer directly contacting the upper surface to define an outer membrane portion of the membrane layer disposed between the first spacer and the second spacer and isolating the upper peripheral surface portion.

10. The membrane-based sensor of claim 1, further comprising:

at least one layer portion positioned directly beneath the membrane layer, the at least one layer portion surrounding the backside trench and defining a further side of the backside trench, the first spacer spaced laterally inward from the further side of the backside trench.

11. The membrane-based sensor of claim 10, wherein the at least one layer portion includes a dielectric layer portion positioned directly beneath the membrane layer and a substrate layer portion positioned directly beneath the dielectric portion, the dielectric layer portion and the substrate layer portion surrounding the backside trench and defining the further side.

12. The membrane-based sensor of claim 1, wherein the membrane layer and the cap layer define respective semiconductor layers.

13. The membrane-based sensor of claim 1, further comprising at least one layer portion positioned below the membrane layer and surrounding the backside trench, the membrane layer extending continuously and without discontinuity across a complete lateral extent of the membrane layer and secured between the at least one layer portion and the cap layer such that the membrane layer does not freely move in the membrane plane.

14. The membrane-based sensor of claim 1, wherein the first spacer is in direct contact with upper surface of the membrane layer without regard to an electrical state of the sensor.

15. A membrane-based sensor, comprising:

a membrane layer defining a membrane plane and including an upper surface and a lower surface facing away from one another relative to the membrane plane;

a backside trench defined on a lower side by the lower surface;

a central cavity defined on a first side by the upper surface;

a cap layer positioned above the central cavity and the upper surface;

a first spacer extending from the cap layer to the upper surface of the membrane layer and integrally formed with the cap layer, the first spacer having (i) a first inner surface that defines a second side of the central cavity and (ii) a first outer surface that faces away from the first inner surface, the first spacer directly contacting the upper surface to define an inner membrane portion of the membrane layer a peripheral cavity positioned laterally relative to the central cavity and defined on a third side by the upper surface of the membrane layer and defined on a fourth side by the first outer surface of the first spacer;

a second spacer extending from the cap layer to the upper surface of the membrane layer and integrally formed with the cap layer, the second spacer having a second inner surface that defines a fifth side of the peripheral cavity, the second spacer directly contacting the upper surface to define an outer membrane portion of the membrane layer disposed between the first spacer and the second spacer, wherein the peripheral cavity extends laterally beyond the backside trench; and a second dielectric layer portion positioned directly beneath the membrane layer, the second dielectric layer portion surrounding the backside trench, wherein the central cavity is sealed at a reference pressure.

\* \* \* \* \*